(12) United States Patent
Atallah et al.

(10) Patent No.: US 6,509,771 B1
(45) Date of Patent: Jan. 21, 2003

(54) ENHANCED OPERATIONAL FREQUENCY FOR A PRECISE AND PROGRAMMABLE DUTY CYCLE GENERATOR

(75) Inventors: Francois I. Atallah, Raleigh, NC (US); Anthony Correale, Jr., Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/017,071

(22) Filed: Dec. 14, 2001

(51) Int. Cl.[7] ............................................. H03K 3/017
(52) U.S. Cl. ...................................... 327/175; 327/99
(58) Field of Search ......................... 327/99, 172, 175, 327/176, 291, 263, 264, 276, 277, 278, 285, 407, 408, 152, 153, 155, 158, 159

(56) References Cited

U.S. PATENT DOCUMENTS

| | | | |
|---|---|---|---|
| 4,414,637 A | 11/1983 | Stanley .......................... 364/569 |
| 4,482,826 A | 11/1984 | Ems et al. .................... 327/270 |
| 4,636,734 A | 1/1987 | Genrich .................. 331/177 R |
| 4,777,385 A | * 10/1988 | Hartmeier .................... 327/379 |
| 4,881,041 A | 11/1989 | Kawanabe et al. .......... 327/167 |
| 5,157,277 A | 10/1992 | Tran et al. ................... 327/156 |
| 5,220,216 A | * 6/1993 | Woo .............................. 326/50 |
| 5,231,320 A | 7/1993 | Kase ............................ 327/277 |
| 5,245,231 A | 9/1993 | Kocis et al. ................. 327/277 |
| 5,302,920 A | 4/1994 | Bitting ........................... 331/45 |
| 5,349,311 A | 9/1994 | Mentzer ........................ 331/57 |
| 5,394,114 A | 2/1995 | Davis .......................... 331/1 A |
| 5,406,590 A | 4/1995 | Miller et al. ................ 375/376 |
| 5,451,893 A | 9/1995 | Anderson .................... 327/174 |
| 5,550,498 A | * 8/1996 | Kwan et al. ................. 327/175 |
| 5,563,605 A | 10/1996 | McEwan ..................... 342/202 |
| 5,818,890 A | 10/1998 | Ford et al. ................... 375/371 |
| 5,903,747 A | 5/1999 | Casal .......................... 395/556 |
| 5,923,200 A | 7/1999 | Shimizume ................. 327/277 |
| 5,933,039 A | 8/1999 | Hui et al. .................... 327/262 |
| 5,949,292 A | 9/1999 | Fahrenbruch et al. ......... 331/57 |
| 6,028,491 A | 2/2000 | Stanchak et al. ............. 331/75 |
| 6,040,725 A | 3/2000 | Lee et al. .................... 327/175 |
| 6,426,660 B1 | * 7/2002 | Ho et al. ..................... 327/175 |
| 6,441,600 B1 | * 8/2002 | Atallah et al. ........... 324/76.11 |

* cited by examiner

Primary Examiner—My-Trang Nuton
(74) Attorney, Agent, or Firm—Scully, Scott, Murphy & Presser; Scott W. Reid

(57) ABSTRACT

A precise and programmable duty cycle adjuster which can produce a user definable duty cycle clock signal comprises a digital to analog converter (DAC), low pass filter (LPF), operational transconductance amplifier (OTA), and a unique voltage controlled duty cycle generator (VCDCG). The circuit has the ability to produce a user programmable duty cycle clock signal with precision over a broad range of operational frequencies. The VCDCG circuit employs a number of delay stages, each of which has a current starved inverter which is immediately followed by a conventional inverter to allow duty cycle corrections to be either additive or subtractive. For a fixed number of delay stages, the range of duty cycle selection is inversely proportional to the frequency of an input clock signal. This frequency range limitation is alleviated by designing the VCDCG with a multiple number of delay taps in conjunction with multiple tap points which are multiplexed at the output.

11 Claims, 4 Drawing Sheets

ENHANCED OPERATIONAL FREQUENCY FOR A PRECISE AND PROGRAMMABLE DUTY CYCLE GENERATOR

BACKGROUND OF THE INVENTION

1. Field of the Invention

The present invention relates generally to a precise and programmable duty cycle generator, and more particularly pertains to a precise and programmable duty cycle generator which enhances the operational frequency and precision over which the programmable duty cycle generator can operate.

Almost all ICs require a clock signal to accomplish their operations and be synchronous with other related components. The frequency of this clock determines the performance of the IC. As sub-micron technologies allow designs to operate at higher frequencies, design techniques must also provide for increasing their performance. An adjustable duty cycle clock circuit provides designers with flexibility in their designs, allowing them to meet high-performance and low-power goals. In addition to this flexibility, a programmable duty cycle adjuster provides robustness to the design. After fabrication, if the process was not modeled accurately, the duty cycle can be adjusted through the IC bus, fuses, or primary pins on the IC to operate the IC at the highest possible clock rate.

A prior disclosure, filed as U.S. patent application Ser. No. 10/020,528, on even date herewith, and titled, "A Precise And Programma Duty Cycle Generator", is hereby expressly incorporated by reference herein and describes a circuit to generate/create a user definable duty cycle with precision from an input signal having any duty cycle, and is described with reference to FIGS. 1–4 herein. As explained in that disclosure, for a fixed number of delay block stages the range of duty cycle selection is inversely proportional to the frequency of the signal at CLKIN. Pursuant to the present invention, this frequency range limitation can be alleviated by designing the VCDCG with a broad number of delay taps in conjunction with multiple tap points and multiplexing them at the output.

2. Discussion of the Prior Art

The idea of providing a circuit for duty cycle correction isn't new. The prior art has circuits which correct an incoming signal's duty cycle to a fixed value, typically 50—50. The present invention differs from the prior art by allowing the output corrected signal to be programmable to any value duty cycle with precision.

U.S. Pat. No. 4,881,041 discloses a circuit to correct an incoming signal's duty cycle to a 50/50 duty cycle and is limited to a 50/50 duty cycle correction with no provision for any other duty cycle, and the circuit is completely different from the present invention. U.S. Pat. No. 5,157,277 discloses a circuit to convert a sine wave input clock signal at a 50/50 duty cycle into a square wave signal with a variable duty cycle. The conversion circuit is limited to sine wave inputs, and is significantly different from the present invention which addresses square wave signals.

SUMMARY OF THE INVENTION

Accordingly, it is a primary object of the present invention to provide an enhanced operational frequency for a precise programmable duty cycle generator which enhances the operational frequency and precision over which a programmable duty cycle generator can operate.

BRIEF DESCRIPTION OF THE DRAWINGS

The foregoing objects and advantages of the present invention may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

High Level Overview

A programmable duty cycle generator circuit is comprised of:

(i) a set of register bits holding the digitally encoded duty cycle data;

(ii) an n-bit Digital-to-Analog Converter (DAC) used to convert the digitally encoded desired duty cycle into an analog voltage;

(iii) an Operational Transconductance Amplifier (OTA) used to compare the analog voltage representing the desired duty cycle with an analog feedback voltage;

(iv) a Voltage Controlled Duty Cycle Generator (VCDCG) which generates the desired duty cycle; and (v) a Low Pass Filter (LPF) which generates an analog voltage which is the feedback signal fed to the OTA thereby providing the closed loop operation.

Figure 1:
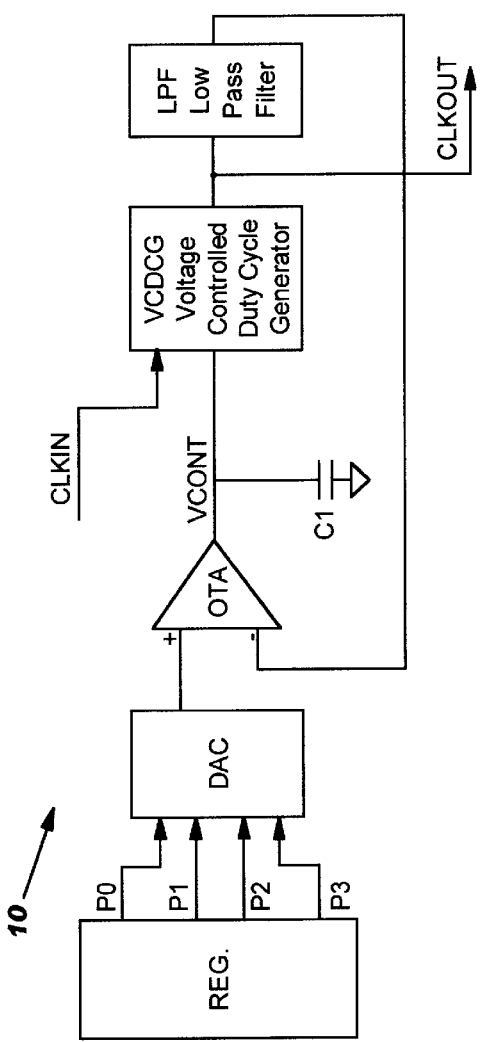
FIG. 1 is a block diagram of a single-ended programmable duty cycle correction circuit.

The inputs to the VCDCG are the input clock signal and the output of the OTA. The output of the VCDCG is the duty cycle corrected clock. FIG. 1 illustrates this basic configuration in a block diagram of one embodiment of a single-ended programmable duty cycle generator circuit. The programmable duty cycle generator circuit of FIG. 1 represents a single-ended implementation. A differential implementation which has higher noise immunity can be employed using the teachings of this disclosure and known differential techniques, and is discussed in greater detail in U.S. patent application filed as Ser. No. 10/020,528, on even date herewith, and titled "a precise And Programmable Duty Cycle Generator".

The Low Pass Filter (LPF) is the duty cycle measuring circuit whose output voltage is subtracted in the Operational Transconductance Amplifier (OTA) from a reference voltage generated from the DAC whose inputs, P0 through P3, set the equivalent DC voltage associated with the duty cycle desired. In this illustration, four inputs, P0–P3, define the encoded desired duty cycle. The OTA (Operational Transconductance Amplifier) generates a current that is proportional to the difference of its input voltages. If the two voltages are equal, then no current will charge or discharge the capacitor C1 leading to a DC voltage at VCONT that forces the waveform at CLKOUT to be equal to the desired duty cycle. On the other hand, if the duty cycle at CLKOUT is less than the desired duty cycle, then the output of the Low Pass Filter will be smaller than the output of the DAC. The OTA will generate a current proportional to the difference between the output of the DAC and the output of the Low Pass Filter. The current will charge the capacitor causing VCONT to rise and the duty cycle at CLKOUT to increase. The mechanism is the same but in the other direction if the duty cycle of CLKOUT is greater than the desired duty cycle. Note that the Voltage Controlled Duty Cycle Generator (VCDCG) inverts CLKIN. If a non-inverting signal is desired, the output of the DAC and the output of the Low Pass Filter should be swapped going into the OTA.

FIG. 1 illustrates a generic embodiment of a programmable duty cycle generator. The register and the DAC provide the programmable function to the duty cycle generator, and function to generate a programmable DC voltage representative of the desired duty cycle. A nonprogrammable embodiment of a duty cycle generator might substitute a fixed DC voltage input to the OTA.

Figure 2:
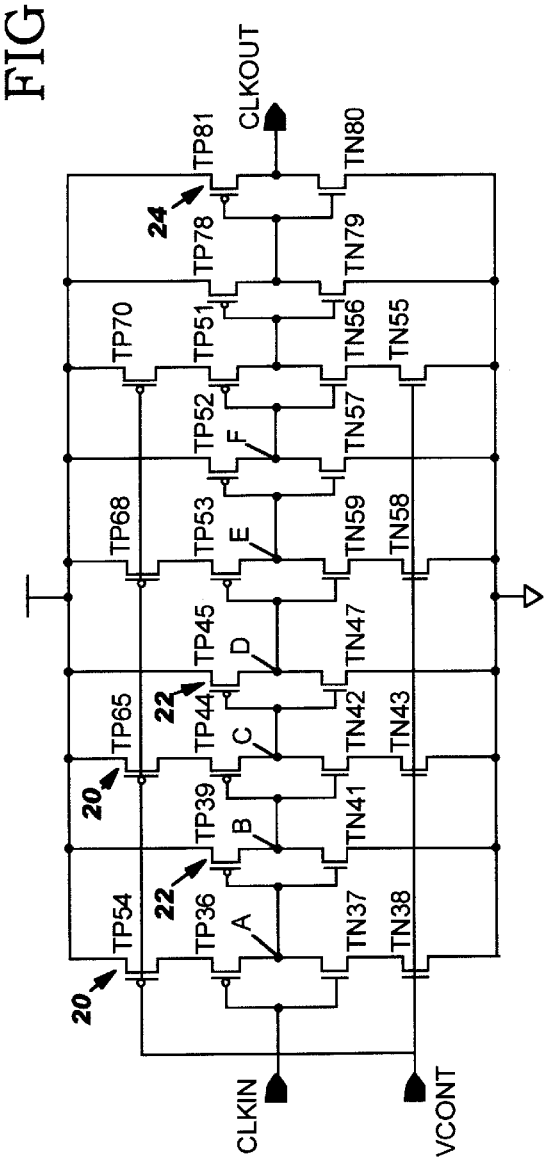
FIG. 2 illustrates a Voltage Controlled Duty Cycle Generator (VCDCG) which is a very important aspect of the present invention.

FIG. 2 illustrates an embodiment of a Voltage Controlled Duty Cycle Generator (VCDCG) which is a very important aspect of the present invention.

The Voltage Controlled Duty Cycle Generator is comprised of a plurality of current starved inverters 20, each of which comprises 2 PFETs: The top PFET (e.g. TP54 in stage 1) serves as a current source while the second PFET (e.g. TP36 in stage 1) in series serves as a switch, and 2 NFETs: The bottom NFET (e.g. TN38 in stage 1) serves as a current source while the second NFET (e.g. TN37 in stage 1) in series serves as a switch. These are followed by a series inverter 22 which presents a capacitive load to the current sources, to provide either additive or subtractive duty cycle corrections. The plurality of current starved inverters are controlled by the output control signal voltage VCONT of the operational amplifier which is connected to both the PFET current sources and the NFET current sources. The multiple stages of 20–22 are followed by a final conventional inverter 24 to provide a desired polarity clock pulse. The conventional inverter 24 can be omitted to provide opposite polarity clock pulses.

Unlike a conventional current starved inverter, the VCONT signal is connected to both the PFET current sources (TP64, TP66, TP68, or TP70) as well as the NFET current sources (TN38, TN43, TN58, or TN55). As the voltage at VCONT increases, the PFET current source will provide a smaller current to charge the capacitive load of the series inverter 22, and the NFET current source will provide a larger current to discharge the capacitive load of the series inverter 22. Therefore, at the output of each current starved inverter 20 the waveform has a slow rising edge and a fast falling edge. Because of the difference in edge rates, the output of each CMOS inverter 22 will have a longer falling delay (tphl) than the rising delay (tplh). This difference in delays produces a duty cycle correction that is controlled by VCONT. This mode of operation is reversed when the voltage at VCONT decreases.

Figure 3:
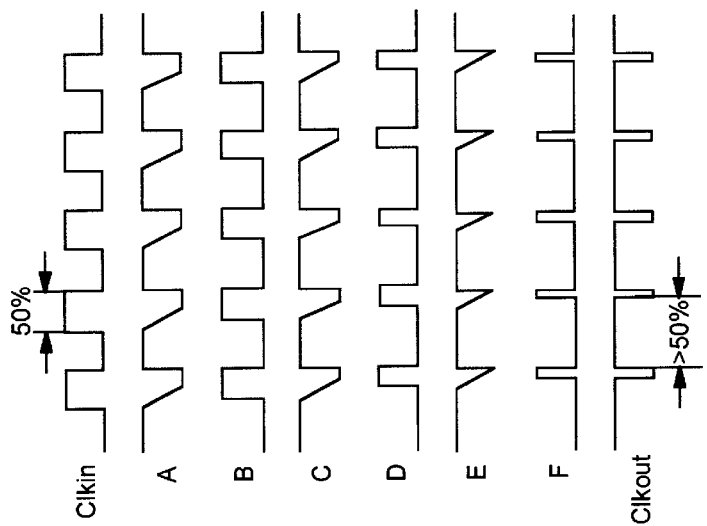
FIG. 3 illustrates a timing diagram for a 3-stage VCDCG for the case where a longer uptime is desired.

FIG. 3 illustrates a timing diagram for a 3-stage VCDCG for the case where a longer uptime is desired, wherein the waveforms A–F correspond to the nodes A–F of FIG. 2. As can be seen, the falling transitions associated with the output stages of the current starved inverters (nodes A, C and E) is 'slow' and rising transitions are crisp. The inverters following the current starved inverters invert the signals and provide crisp edges. Note however, that the pulse widths have been reduced and continue to be reduced as the signals propagate down the line. The final inverter 24 in the VCDCG reshapes the signal with crisp edges and supports the needed output drive, polarity and phase.

Note that while this VCDCG circuit may appear similar to a voltage controlled delay line (VCDL), it is quite a bit different. Typically in a VCDL all the elements are current starved inverters with the possible exception of the output driving section. The goal in a VCDL is to control delay, not duty cycle. In fact, the duty cycle within a VCDL is kept relatively constant There are generally two voltage controls used within the VCDL; one for the PFETS, VCONTP, and another for the NFETS, VCONTN. To increase delay, the VCONTP is increased towards the power supply level whereas the VCONTN is decreased towards ground. In essence, the applied control voltages are moving in opposite directions. In contrast, the VCDCG employs a current starved inverter which is immediately followed by a conventional inverter to allow duty cycle corrections to be either additive or subtractive. Also, this circuit is unlike voltage controlled delay lines in that the current starved inverters are controlled by a single voltage, Vcont, and the series inverter isn't voltage controlled at all. The single control voltage causes the current starved inverter's delay to degrade/improve on one transition while improve/degrade on the other transition.

Figure 4:
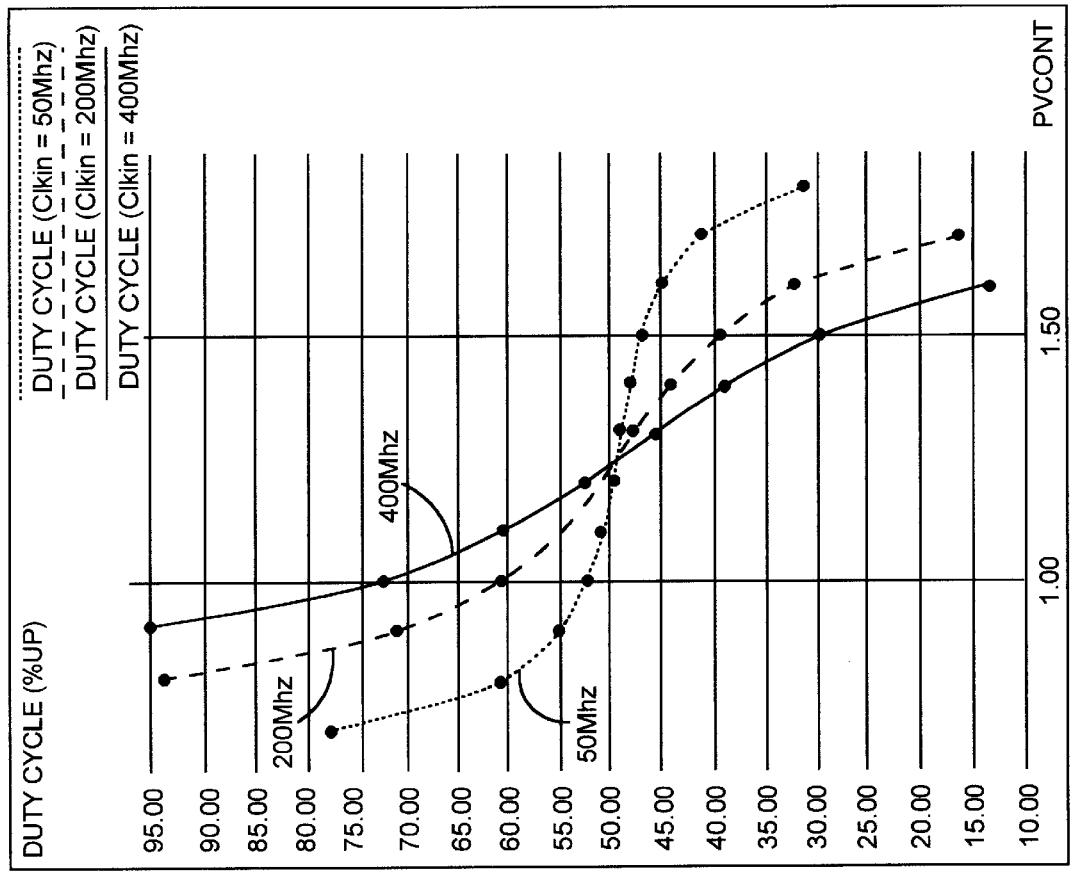
FIG. 4 shows the DUTY CYCLE (%) for a 50 Mhz, 200 Mhz, and a 400 Mhz input clock versus VCONT for a fixed chain length.

FIG. 4 shows the DUTY CYCLE (%) for a 50 Mhz, 200 Mhz, and a 400 Mhz input clock versus VCONT for a fixed chain length.

Examining the 50 MHz curve in FIG. 4 reveals that the duty cycle can be controlled from 78% down to nearly 0% by varying VCONT (the last point on the plot is 32% but by increasing VCONT a lower duty cycle can be achieved). The higher frequency operations for the same number of stages within the VCDCG allow duty cycles to range from nearly 95% down to nearly 0% over a narrower range of VCONT. The shape of the 50 MHz curve relative to the higher frequency curves clearly shows that more precision is available but at the cost of operational duty cycle breadth. Hence, the stage length can be specified for a given frequency to adjust for more precision as well as duty cycle range.

The number of stages of the VCDCG of FIGS. 1 and 2 depends on the frequency of the CLKIN signal and the desired voltage range at the VCONT terminal. For a fixed number of delay blocks, the voltage range at VCONT required to span from the desired minimum duty cycle to the desired maximum duty cycle is inversely proportional to the frequency of the signal at CLKIN. Therefore, as explained in the prior disclosure, the number of stages can be based on the range of expected input frequencies, the allowed voltage span at VCONT, and the desired duty cycle range and precision of the output signal at CLKOUT. Pursuant to the present invention, this frequency range limitation can be alleviated by designing the VCDCG with a broad number of delay taps in conjunction with multiple tap points and multiplexing them at the output. The controls of the multiplexor can then select the appropriate frequency range for best duty cycle control.

Figure 5:
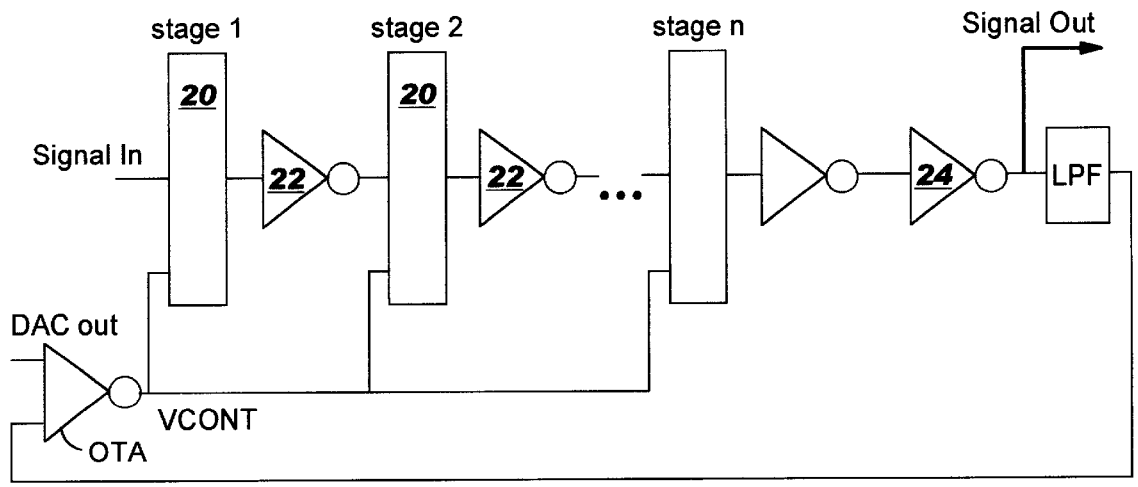
FIG. 5 represents the single-ended programmable duty cycle generator circuit of FIGS. 1 and 2 in block diagram form, wherein the VCDCG section is comprised of n-stages, each having an inverted output, and the last stage is connected to an output inverter.

FIG. 5 represents the single-ended programmable duty cycle correction circuit of FIGS. 1 and 2 in a simplified block diagram form. The VCDCG section is comprised of n-stages 20, with each stage 20 having an inverter 22 at its output to provide an inverted output, and the last stage n is connected to the output inverter 24, as explained in further detail with reference to FIG. 2 in particular.

Figure 6:
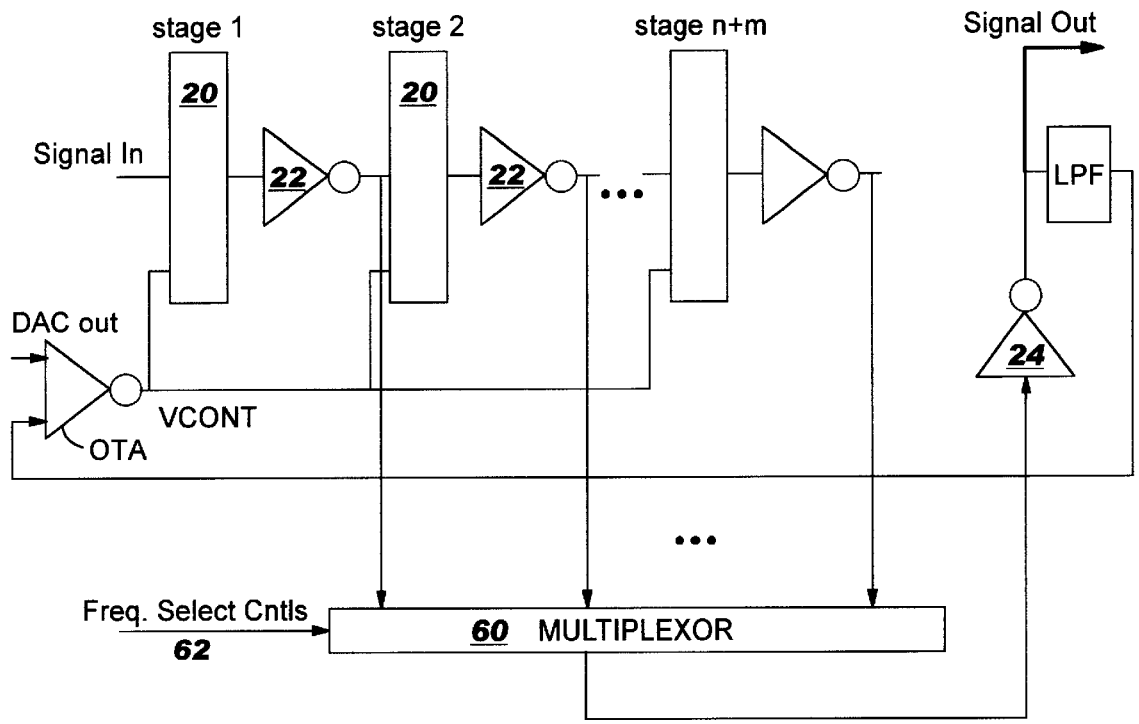
FIG. 6 represents the disclosed concept of the present invention in block diagram form wherein the VCDCG has been modified such that there are now n+m stages and the outputs of each and all of the stages are directed to a non-inverting multiplexor which is then connected to an output inverter.

FIG. 6 represents the disclosed concept of the present invention in block diagram form wherein the VCDCG has been modified such that there are now n+m stages and the outputs of each and all of the stages are directed to a non-inverting multiplexor 60 which is then connected to the output inverter 24. The total number of stages chosen is consistent with the range of frequencies that may be encountered. The frequency select control lines 62 input to the multiplexor 60 determine which stage of the VCDCG is to be switched and steered to the output. This configuration operates the same as the prior configuration with the exception that the length of the delay chain is now programmable enabling a broader operational frequency range with an increase in precision. For higher frequency operation, an earlier tap point is chosen, whereas for a lower frequency operation a later tap point can be chosen. The choice of tap point is a function of the incoming frequency, the desired duty cycle range and the precision of the chosen duty cycle. Since the multiplexor is now a component of the loop, any duty cycle variance introduced by the mux 60 will be negated. The multiplexor's delay is factored into the overall loop delay. The multiplexor 60 can also be designed to incorporate the output inverter 24, thereby reducing the number of components and sweeping the delay of the inverter into it. The width of the multiplexor is a function of the number of tap points desired.

Figure 7:
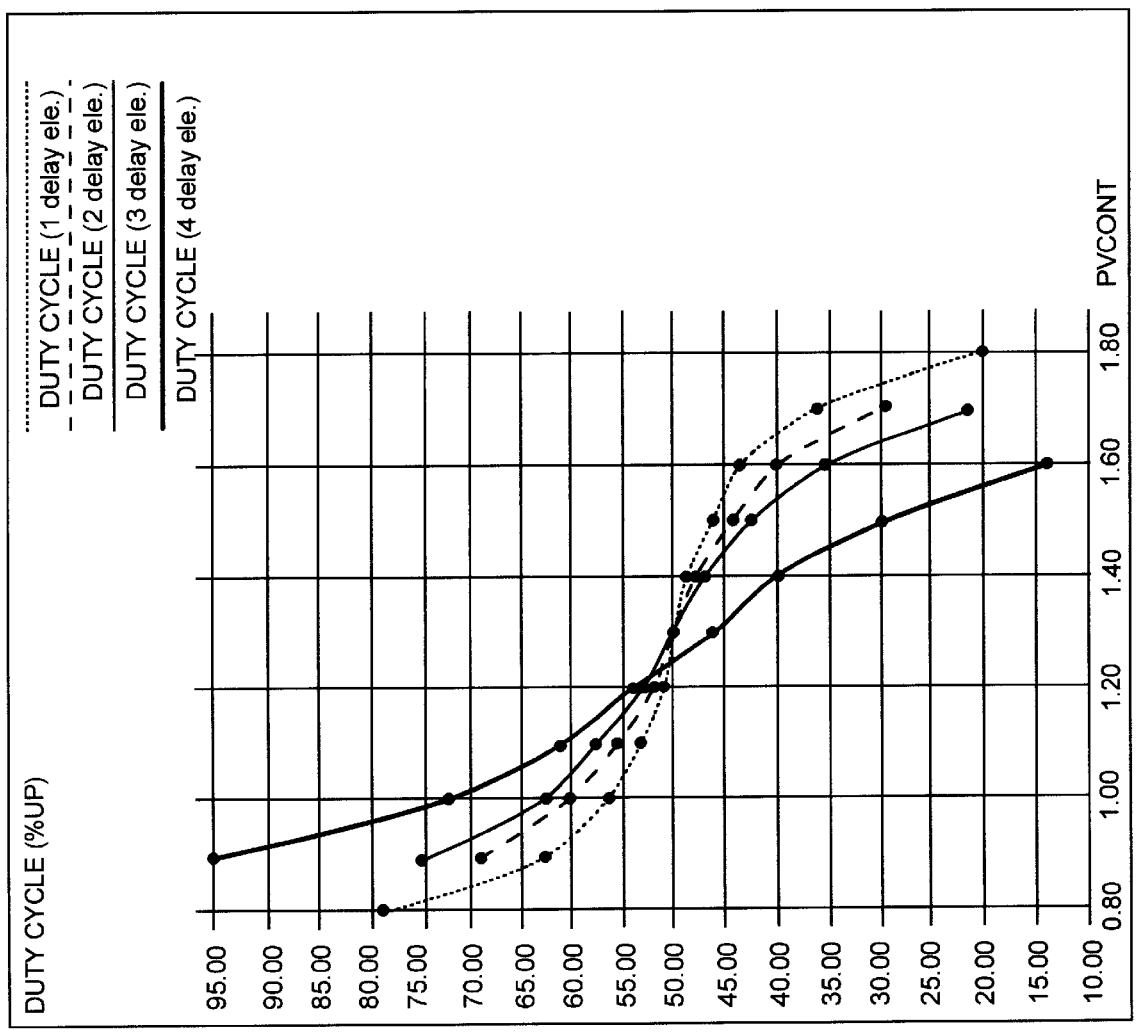
FIG. 7 illustrates the effect of having varying chain lengths within the VCDCG for an input with a fixed frequency of 400 MHz, and illustrates Duty Cycle versus VCONT versus a variable VCDCG chain length.

FIG. 7 illustrates the effect of having varying chain lengths within the VCDCG for an input with a fixed frequency of 400 MHz, and illustrates Duty Cycle versus VCONT versus a variable VCDCG chain length.

Examination of FIG. 7 shows the advantage of being able to select the various delay element tap points within the VCDCG. The curve which is associated with 4 delay elements is the same as the 400 MHz curve in FIG. 4. For a fixed frequency of 400 MHz, this curve spans the broadest range of duty cycles, but is also the steepest. By selecting a lower tap point, say the curve which is associated with using the output of the first delay element, the duty cycle range is reduced, but the curve is much flatter. This will result in higher precision (less duty cycle variance relative to VCONT). So, we have demonstrated that by having a selectable delay tap means within the VCDCG we can "tune" both the frequency range and the desired range and precision of the duty cycle. Remember that the maximum length of the delay chain dictates the highest frequency that can be run. By being able to select lower tap points allows us to support frequencies at and below the maximum while being able to optimize the duty cycle range and precision.

In summary, a circuit configuration has been disclosed which can enhance the operational frequency range and precision of the previously disclosed circuit configuration for producing a user definable duty cycle with precision. This scheme allows the precise and programmable duty cycle circuit to support a wider range of frequencies and duty cycle sensitivities which are now selectable. Applications wherein the incoming frequency is variable or selectable can readily employ this approach and have the desired output duty cycle without loss of precision. Another advantage of this approach is that it enables the product developer to be able to "tune" out design or modeling deficiencies after the product has been manufactured thereby reducing cost and time to market.

While several embodiments and variations of the present invention for an enhanced operational frequency for a precise and programmable duty cycle generator are described in detail herein, it should be apparent that the disclosure and teachings of the present invention will suggest many alternative designs to those skilled in the art.

Having thus described our invention, what we claim as new, and desire to secure by Letters Patent is:

1. A programmable circuit for generating an output clock signal having a desired duty cycle, comprising:

an operational amplifier for comparing an analog voltage representing the desired duty cycle with an analog feedback voltage, and generating an output control signal in response thereto;

a voltage controlled duty cycle generator, responsive to the output control signal of the operational amplifier and having an input clock signal, for generating an output clock signal having the desired duty cycle, wherein the voltage controlled duty cycle generator comprises a plurality of stages, and each stage produces an output tap signal;

a multiplexor for receiving an output tap signal from each of the stages and which multiplexor is controlled to select and pass one stage output tap signal having a selected frequency and duty cycle as the output clock signal;

a low pass filter, responsive to the output clock signal, for measuring the duty cycle of the output clock signal and for generating the analog feedback voltage for the operational amplifier, thereby providing a closed feedback loop operation.

2. The circuit of claim 1, further including an n-bit digital to analog converter for converting a digitally encoded desired duty cycle into the analog voltage.

3. The circuit of claim 1, wherein the multiplexor comprises:

a non-inverting multiplexor, the output of which is connected to an output inverter of the voltage controlled duty cycle generator.

4. The circuit of claim 3, wherein the multiplexor incorporates the output inverter such that multiplexor and the output inverter are components of the feedback loop.

5. The circuit of claim 1, wherein the multiplexor is controlled by frequency select control lines which are input to the multiplexor to determine which stage output tap signal is selected as the output clock signal, wherein the choice of output tap signal is a function of the frequency of an input clock signal, and for a higher frequency input clock signal, an earlier tap signal is chosen, and for a lower frequency input clock signal a later tap signal is chosen.

6. The circuit of claim 1, including a register for storing a set of register bits representative of the digitally encoded desired duty cycle and providing an input to the digital to analog converter.

7. The circuit of claim 1, wherein the operational amplifier comprises an operational transconductance amplifier for generating an output current proportional to a difference of its input voltages; and a capacitor for receiving the generated output current and for charging or discharging the capacitor to produce a voltage across the capacitor which controls the voltage controlled duty cycle generator.

8. The circuit of claim 1, wherein the output of the digital to analog converter is applied to a noninverting input of the operational amplifier, and the output of the low pass filter is applied to an inverting input of the operational amplifier, such that the voltage controlled duty cycle generator inverts the clock signal to produce the output clock signal.

9. The circuit of claim 1, wherein the voltage controlled duty cycle generator comprises a plurality of stages, each of which comprises a current starved inverter, comprised of PFET current sources and NFET current sources followed by a series inverter which presents a capacitive load to the current sources, to provide either additive or subtractive duty cycle corrections, the plurality of current starved inverters being controlled by the output control signal voltage of the operational amplifier which is connected to both the PFET current sources and the NFET current sources, and as the output control voltage increases, the PFET current sources provide a smaller current to charge the capacitive load, and the NFET current sources provide a larger current to discharge the capacitive load, such that the output waveform has a slow rising edge and a fast falling edge, and the difference in edge rates causes the output of the inverter to have a longer falling delay than a rising delay to produce a duty cycle that is controlled by the output control signal voltage of the operational amplifier.

10. The circuit of claim 9, wherein the plurality of stages is followed by an inverter.

11. The circuit of claim 1, wherein the low pass filter comprises an RC low pass filter.

* * * * *